United States Patent
Majtan

(10) Patent No.: US 9,928,733 B2
(45) Date of Patent: Mar. 27, 2018

(54) VEHICLE KEY TESTING DEVICE

(71) Applicant: Nissan North America, Inc., Franklin, TN (US)

(72) Inventor: Philip T Majtan, Highland, MI (US)

(73) Assignee: NISSAN NORTH AMERICA, INC., Franklin, TN (US)

( * ) Notice: Subject to any disclaimer, the term of this patent is extended or adjusted under 35 U.S.C. 154(b) by 22 days.

(21) Appl. No.: 15/083,430

(22) Filed: Mar. 29, 2016

(65) Prior Publication Data

US 2017/0287326 A1    Oct. 5, 2017

(51) Int. Cl.
*G08C 25/00* (2006.01)
*B60R 25/24* (2013.01)
*G01R 29/08* (2006.01)
*G07C 9/00* (2006.01)

(52) U.S. Cl.
CPC ............ *G08C 25/00* (2013.01); *B60R 25/245* (2013.01); *G01R 29/0878* (2013.01); *G07C 9/00007* (2013.01)

(58) Field of Classification Search
CPC .. G08C 25/00; B60R 25/245; G01R 29/0878; G07C 9/00007
USPC .......................................................... 340/3.1
See application file for complete search history.

(56) References Cited

U.S. PATENT DOCUMENTS

| | | | | |
|---|---|---|---|---|
| 5,739,766 A * | 4/1998 | Chaloux | ............ | G06K 7/10336 235/380 |
| 6,657,214 B1 * | 12/2003 | Foegelle | ............ | G01R 29/0821 250/496.1 |
| 2001/0028296 A1 * | 10/2001 | Masudaya | .......... | G07C 9/00309 340/5.61 |
| 2003/0095038 A1 * | 5/2003 | Dix | ......................... | G07C 5/008 340/425.5 |
| 2006/0017630 A1 * | 1/2006 | Kildal | ................... | G01R 29/105 343/703 |
| 2006/0208740 A1 * | 9/2006 | Powell | ............... | G01R 31/2822 324/426 |
| 2008/0309565 A1 * | 12/2008 | Villarroel | ........... | G01R 29/0871 343/703 |
| 2014/0256373 A1 * | 9/2014 | Hernandez | ............. | H04B 17/12 455/509 |
| 2015/0017928 A1 * | 1/2015 | Griesing | ............ | H04B 17/0085 455/67.14 |

FOREIGN PATENT DOCUMENTS

CN    102707706 B  * 11/2014

OTHER PUBLICATIONS

Google Patents English language translation of Chinese Patent CN 102707706 A, published Oct. 3, 2012.*
Google Patents English language translation of Chinese Patent CN 102707706 B, published Nov. 5, 2014.*
PTO Translation of CN 102707706, Nov. 5, 2014, Zhen Cai et al., "Electromagnetic Immunity Testing System of Body Control Module and Testing Method Therof."*

* cited by examiner

*Primary Examiner* — Edwin Holloway, III
(74) *Attorney, Agent, or Firm* — Global IP Counselors, LLP

(57) ABSTRACT

A vehicle key testing device includes a housing, an antenna, and an electrical input. The housing defines an interior space and is configured to have a vehicle key positioned into the interior space. The antenna is mounted in the interior space. The electrical input is configured to activate at least one wireless aspect of the vehicle key.

18 Claims, 6 Drawing Sheets

US 9,928,733 B2

1

VEHICLE KEY TESTING DEVICE

BACKGROUND

Field of the Invention

The present invention generally relates to vehicle key testing device. More specifically, the present invention relates to a vehicle key testing device that quickly and easily enables a vehicle key to be tested without physically using the key on a vehicle.

Background Information

In conventional key testing, as shown in FIG. 1, a tester T is required to test a vehicle key VK on an actual vehicle V. In other words, the tester has to walk to different area around the vehicle to determine whether each of the individual receiving antennas in the vehicle was capable of receiving a signal from the vehicle key VK. As is understood, the vehicle key VK transmits a wireless signal when a button is push. For example, when the door open button DO is pushed, the vehicle key VK sends a signal instructing the door of the vehicle to unlock. The vehicle key VK can include any suitable buttons (e.g. remote start button RS, liftgate button LG, and alert button A). Moreover, the tester has to determine whether each of the antennas is cable of receiving the individual signals from the multiple aspects of the vehicle key VK, by walking around to differing positions relative to the vehicle V.

SUMMARY

It has been discovered that to improve test time and maintain test accuracy a stationary testing device is necessary. In view of the state of the known technology, one aspect of the present disclosure is to provide a vehicle key testing device comprising a housing, an antenna, and an electrical input. The housing defines an interior space and is configured to have a vehicle key positioned into the interior space. The antenna is mounted in the interior space. The electrical input is configured to activate at least one wireless aspect of the vehicle key.

Another aspect of the present disclosure is to provide a method of testing a vehicle key comprising placing a vehicle key inside a housing of a key testing device, coupling the vehicle key to a control circuit, instructing the control circuit to activate at least one wireless aspect of the vehicle key, receiving a signal from the vehicle with an antenna disposed inside the housing, and transmitting the signal to a control module.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Referring initially to FIGS. 2-5, a vehicle key testing device 12 is illustrated in accordance with a first embodiment. The vehicle key testing device 12 includes a housing 14, a plurality of antennas 16-20, a control circuit 22.

Figure 1:
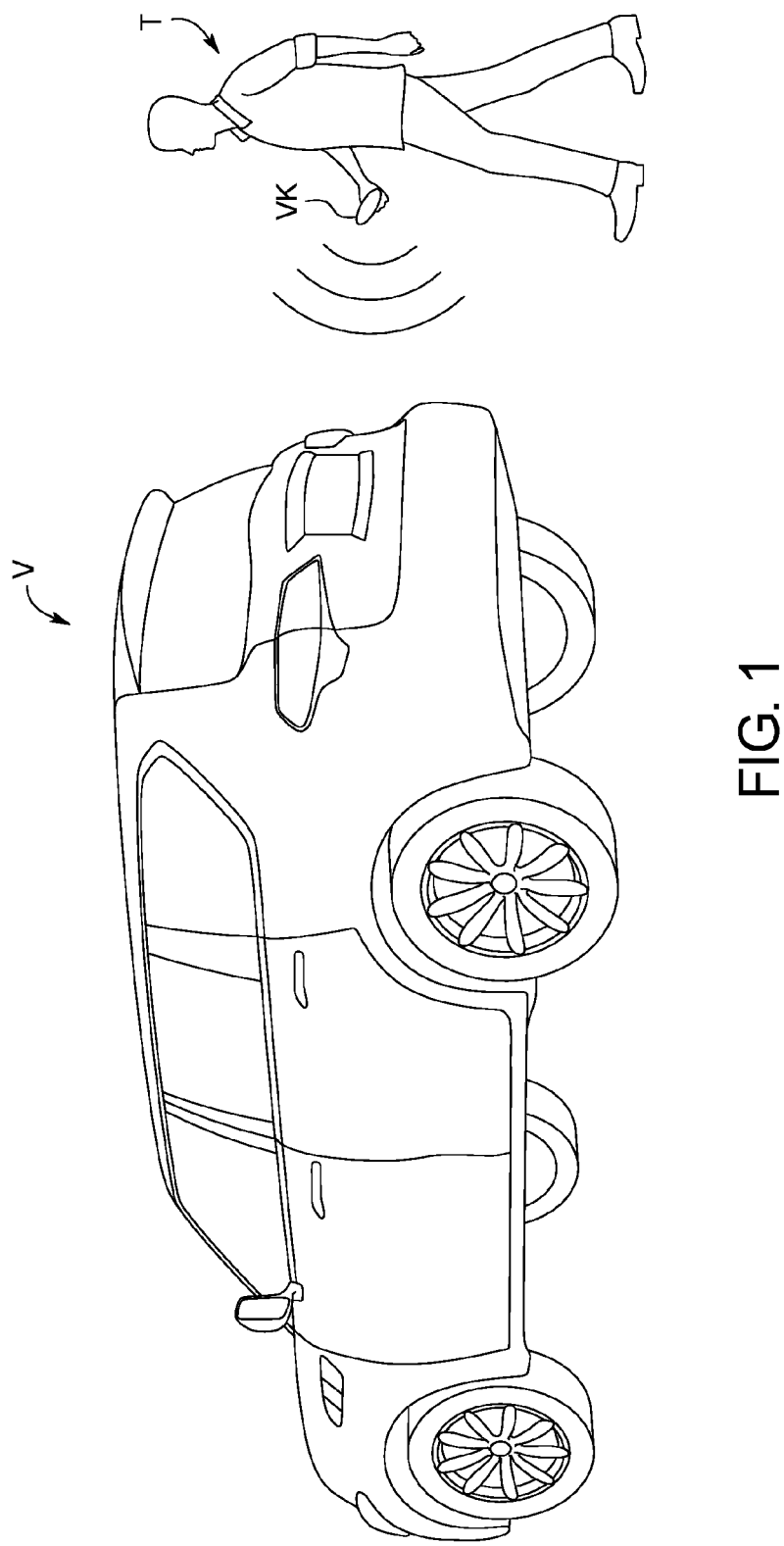
FIG. 1 is a perspective view of the conventional manner in which a vehicle is tested.
Figure 2:
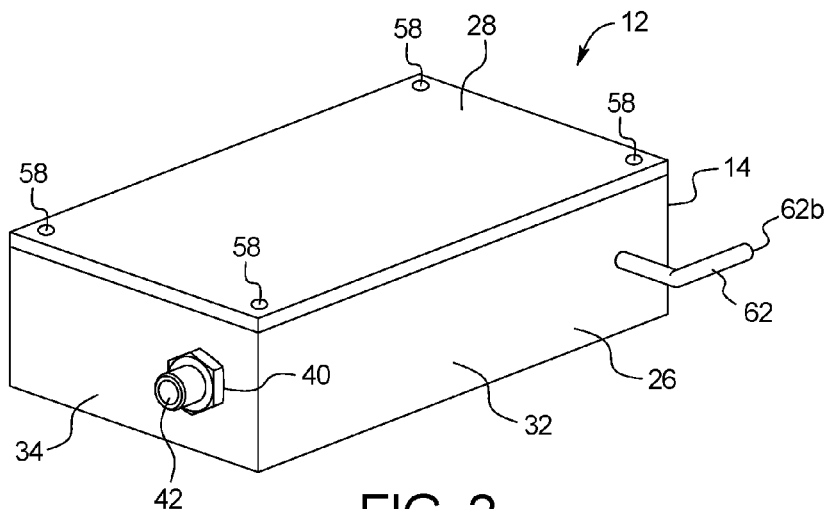
FIG. 2 is a top perspective view of the a vehicle testing device according to an embodiment.
Figure 3:
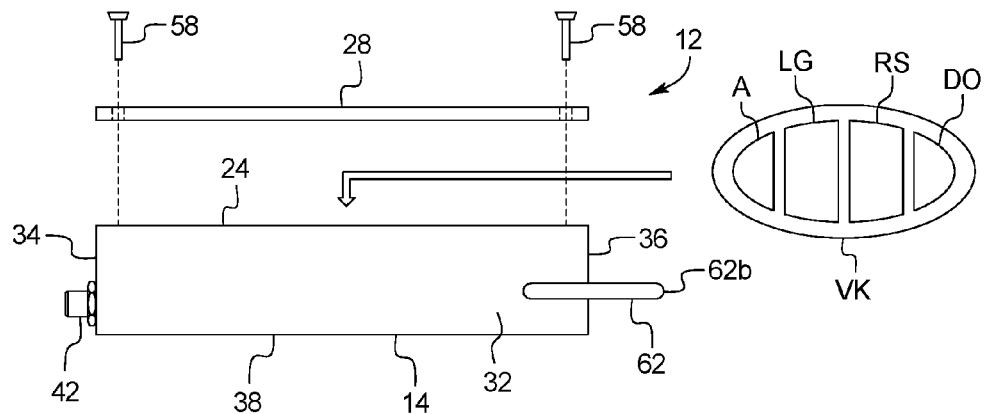
FIG. 3 is an exploded side view of the vehicle testing device shown in FIG. 2.
Figure 4:
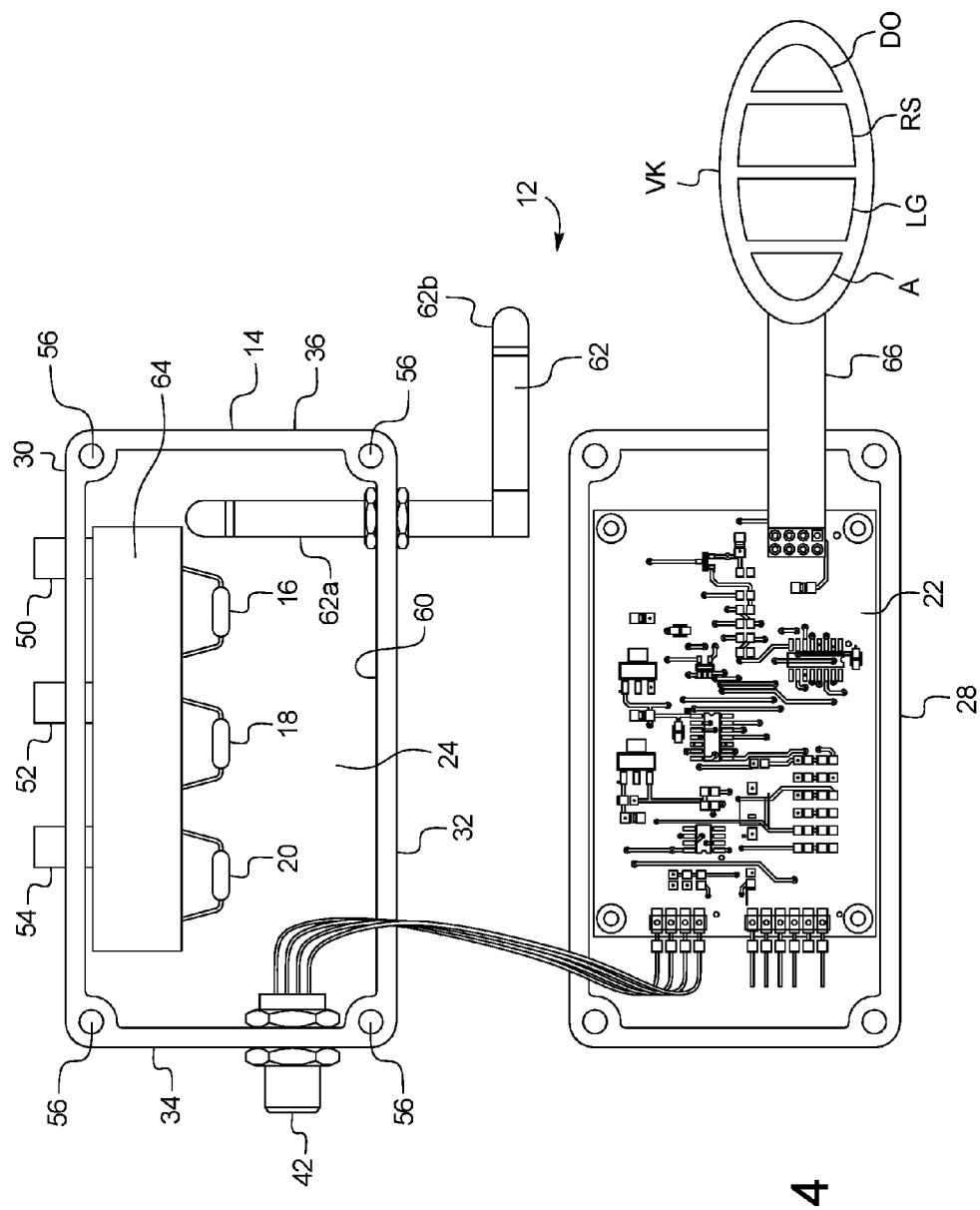
FIG. 4 is a top view of the vehicle testing device shown in FIG. 3 with the cover removed and the vehicle key connected to the vehicle testing device.

As shown in FIGS. 2-4, the housing 14 is preferably a metal housing that defines an interior space 24 configured to have a vehicle key VK positioned therein. The housing 14 includes a body 26 and a removable cover 28. The body 26 includes a first side 30 wall, a second side wall 32 opposite the first side wall 30, a first end wall 34, a second end wall 36 opposite the first end wall 34, and a bottom 38. The first end wall 34 includes an opening 40 with a connector 42 disposed therein; however, the connector can be disposed in any suitable side or position on the housing 14. The connector 42 enables a control box to electrically couple to the control circuit 22. The first side wall 30 includes a plurality of openings 44-48 to enable the plurality of antennas 16-20 to communication with a body 26 control module (BCM). In other words, the plurality of openings 44-48 in the first side 30 wall have connectors 50-54 disposed therein that are configured to couple to leads of a BCM. The connectors 50-54 can be disposed in any portion of position on the housing 14. As shown in FIG. 4, each of the corners of the housing 14 includes openings 56 configured to receive a respective screw 58 (FIG. 3) to fixedly attach the removable cover 28 to the body 26. It is noted that the cover 28 can be attached to the body 26 in any suitable manner, and the description herein is merely exemplary.

The body 26 is generally rectangular and defines a rectangular opening 60 to enable access to the interior space 24. The cover 28 has substantially the same shape and configuration as the body 26 so as to cover 28 the opening 60 to form a generally rectangular box, when the cover 28 is disposed on the body 26. The housing 14 is capable of preventing wireless signals from the vehicle key VK from passing through walls thereof. In one embodiment, such prevention is achieved by using a metal (e.g., aluminum) material. By forming the housing 14 in this manner, it is possible to test multiple vehicle keys in a common area without the signal from one key interfering with other testing devices. It is noted that the housing 14 can be formed from any suitable material and in any suitable configuration, and the description herein is merely exemplary.

An RF antenna extends 62 through and from the second side wall 32 of the housing 14. The RF antenna 62 is a conventional antenna that is capable of detecting a wireless signal from the vehicle key VK and transmitting the wireless signal from the vehicle to the exterior of the testing device, if desired. The RF antenna 62 has a first portion 62a that is disposed in the interior space 24 so as to be capable of detecting the wireless signal from the vehicle key VK, and a second portion 62b that extends from the second side wall 32 so as to be capable of transmitting the wireless signal from the vehicle key VK to an exterior device. Thus, an operator is able to determine whether the vehicle key VK is transmitting a proper signal.

Figure 5:
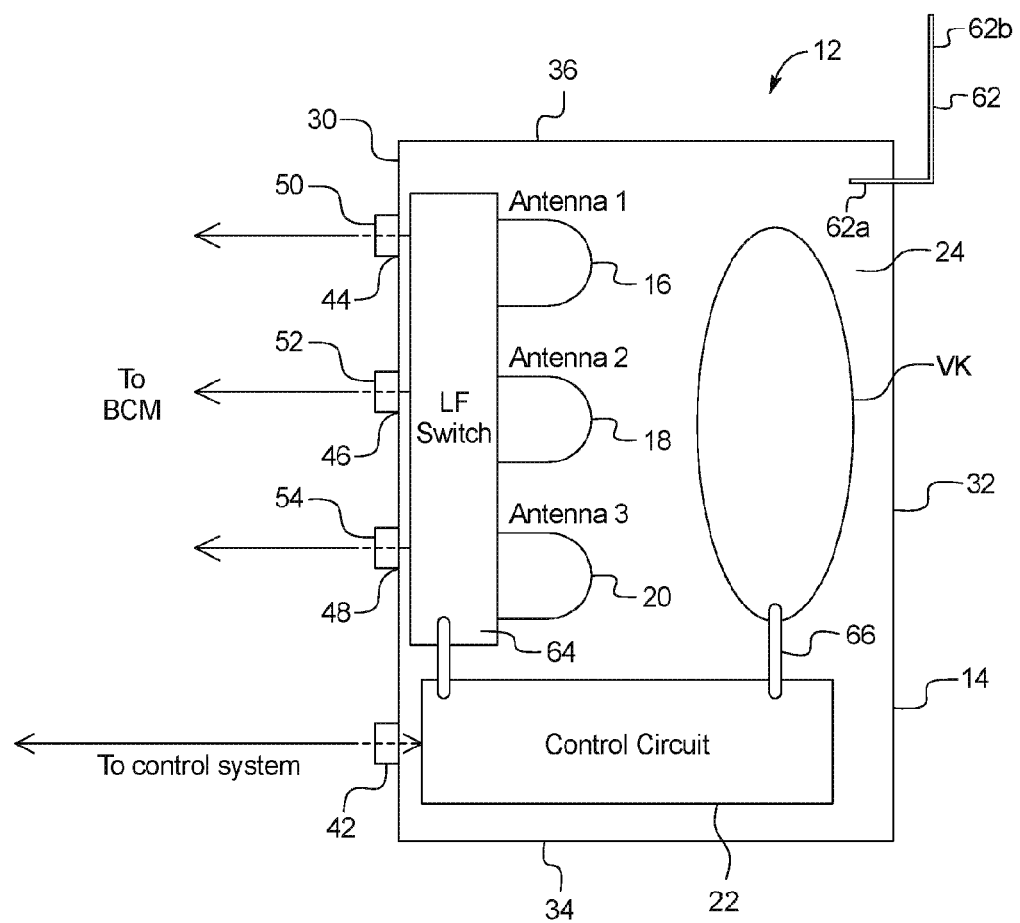
FIG. 5 is a schematic view of the testing device shown in FIG. 4.

As shown in FIGS. 4 and 5, one embodiment includes three antennas, a first antenna 16, a second antenna 18 and a third antenna 20. Each of the antennas is disposed in the interior space 24 of the housing 14 and coupled to a low frequency (LF) switch 64. Accordingly, the antennas 16-20 are capable of connecting to the BCM through the openings 44-48 in the first side wall 30 of the housing 14. Each of the antennas is configured to-receive (or detect) a wireless signal from a vehicle key VK and simulate the antennas of a vehicle V. One of the antennas (e.g., the first antenna 16) can simulate an interior antenna and two of the antennas (the second and third antennas 18 and 20) can simulate exterior antennas. The antennas 16-20 can be any suitable antenna that is capable of receiving a wireless signal from a vehicle key VK. As is understood, the interior antenna can be an antenna that communicates the vehicle start and stop operations when the remote start button RS is activated, while the exterior antennas can be antennas that communicate door unlocking when the door unlock button DO is activated. However, any of the antennas can communicate any desired function or feature desired or a plurality of function of features. For example, the exterior antenna can communicate the vehicle start and stop operations, the unlocking doors operation, the alert and/or the opening of doors and lift gates when any of the appropriate buttons (e.g, DO, LG, A and/or RS) are activated. Moreover, the testing device 12 can have any number of suitable antennas and the antennas can be any suitable type of antenna.

The LF switch 64 is connected to each of the antennas 16-18 and the connectors 44-48 to communicate with the BCM. The LF switch 64 enables a signal received by one of the antennas to be communicated to the BCM. In one embodiment, the LF switch 64 detects an appropriated LF wake-up signal, and an ultra-high frequency (UHF) identification response (ID response) is sent to the BCM. Once mutual authentication has been processed through the UHF channel, the BCM instructs the vehicle door to open. As is understood, in one embodiment, it is not necessary that the vehicle door is actually opened, simply that control system instructed the vehicle key VK to send a wireless signal instructing a vehicle door be opened, and such a signal was properly communicated to the BCM.

Figure 6:
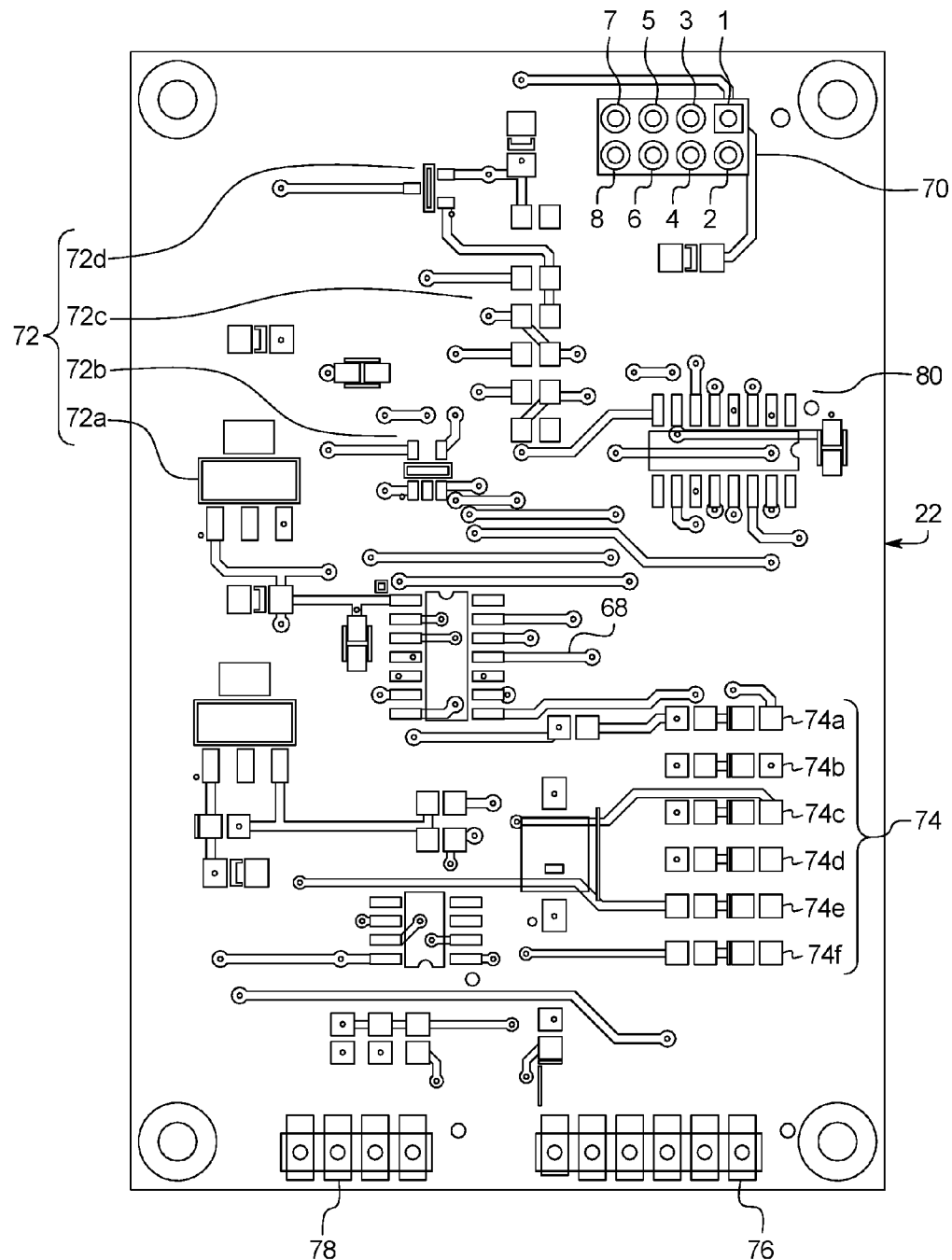
FIG. 6 is a schematic of the circuit board illustrated in FIG. 5.

As shown in FIGS. 4 and 5, the control circuit 22 includes an electrical input 66 that is configured to activate at least one wireless aspect of the vehicle key VK. As shown in FIG. 6, the control circuit 22 includes a controller 68, a vehicle key connector 70, a voltage regulator 72, status LEDs 74 and a serial connector 76. The voltage regulator 72 can include an LDO regulator 72a, an op amp 72b, a pass transistor 72c, and a feedback 72d.

The controller 68 preferably includes a microcomputer with a control program that controls the LF connector and the vehicle key VK, as discussed below. The controller can also include other conventional components such as an input interface circuit, an output interface circuit, and storage devices such as a ROM (Read Only Memory) device and a RAM (Random Access Memory) device. The microcomputer of the controller 68 is programmed to control the connector and the vehicle key VK. The memory circuit stores processing results and control programs such as ones for connector and the vehicle key VK operation that are run by the processor circuit. The controller 68 is operatively coupled to the connector in a conventional manner. The internal RAM of the controller 68 stores statuses of operational flags and various control data. The controller 68 is capable of selectively controlling any of the components of the control circuit in accordance with the control program. It will be apparent to those skilled in the art from this disclosure that the precise structure and algorithms for the controller 68 can be any combination of hardware and software that will carry out the functions of the present invention.

The serial connector 76 is preferably +5 V logic based, and is configured to mate with FTDI TTL-232R-5V (USB to serial) cable. Power is supplied from either the +12V pin on the Bus connector 78, or the +5 V pin on the serial connector 76. The Bus connector 78 is +12 V logic based, and 10 k Ohm pull ups are provided on the control circuit 22.

The vehicle key VK is generally powered by up to 3.2 Volts at up to ~150 mA. The voltage can be controlled by the op amp 72b, which can be a closed loop regulator, and by the controller 68 software adjusting the DAC output. Output voltage is approximately 0.016 Volts×the register setting, up to 200 (corresponding to 3.2 Volts).

The serial connector 76 has the following outputs

| Serial connector | |
| --- | --- |
| RTS | Not used |
| RX | To RX (data out from board) |
| TX | To TX (data in) |
| 5 V | 5 Volts power |
| NC | Not used |
| Gnd | Ground |

The vehicle key connector 70 includes the following outputs

| Vehicle Key connector | |
| --- | --- |
| 1 | KF+ Voltage |
| 2-7 | Output controls, |
| 8 | Gnd |

The DAC provides a reference (or target) voltage on the IN+ op amp input. IN− is connected to the vehicle key output voltage supply. The configuration is a unity gain buffer. The op amp 72b drives the pass transistor 72c to set its output voltage to match the DAC reference voltage. Additionally, the controller 68 can monitor the output voltage and adjust the DAC output gradually so that no sudden changes cause a surge to the vehicle key VK (5.3 V/sec max slew rate).

Drain pins on the driver 80 can control the vehicle key pins directly. The outputs are open-drain. Each drain pin can sink up to 150 mA current. The drain pins are grounded when ON. This simulates the behavior of pushing the button on the vehicle key VK. Additional pins on the driver 80 can control the at least some of the LEDs 74, respectively, controlled by the controller 68.

The controller 68 can be a Microchip PIC16F1704 with 4096 words FLASH ROM and 512 bytes RAM. The controller 68 is generally capable of outputting the serial control byte to the driver 80 once every millisecond. The controller 68 can also sample two analog inputs (e.g., Key voltage and internal DAC feedback) once every 2 ms. The DAC control loop runs every 3 ms, adjusting the DAC output as necessary.

Preferably, there are six (6) status LEDs 74a-74f. These LEDS can indicate any suitable system activity. For example, the LED 74*a* can indicate that the Vehicle key VK is ON, that (voltage is set to >0). LED 74*b* can indicate that the Run SSR status indicator. That is, if LED 74*b* (the Run SSR) is blinking the communication to the driver 80 is operational. LED 74*c* can indicate CPU status. If LED 74*c* is blinking, the operating system and controller 68 are operational. The LEDS 74*d*-74*e* can indicate power to on any of the other elements, e.g. the Bus connector 78, the serial connector 76 and/or the voltage regulator 72.

Applicant notes that the circuitry discussed above for the control circuit 22 is merely exemplary and any suitable circuitry that would enable suitable testing of a vehicle key VK may be used.

Figure 7:
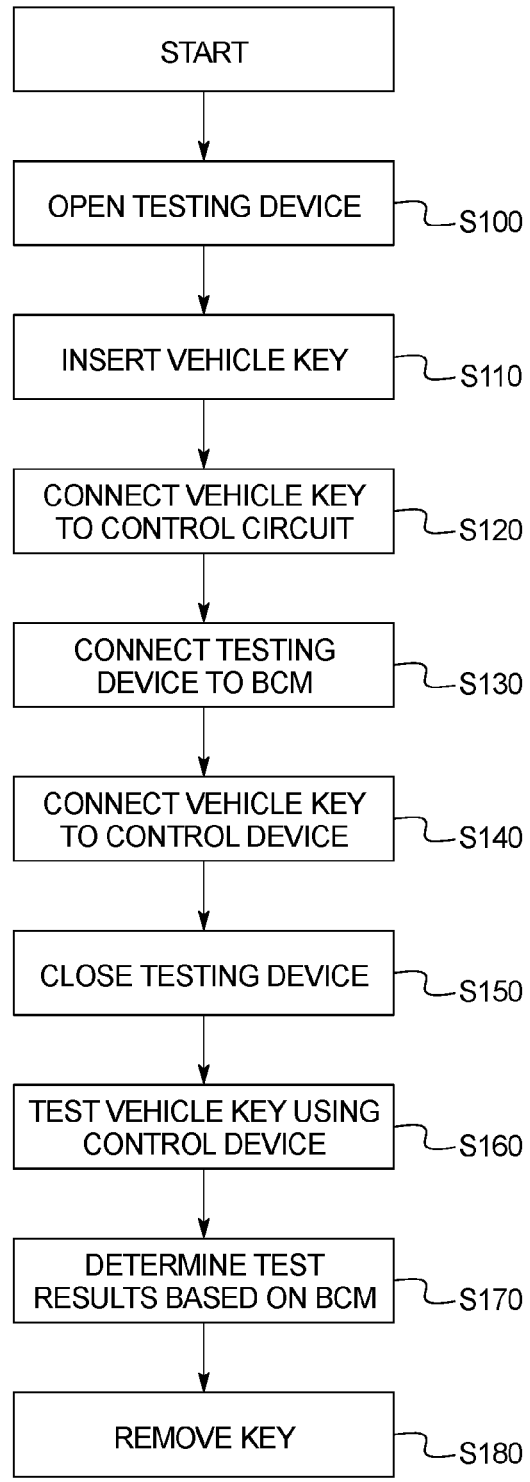
FIG. 7 is a flow chart illustrating the method of testing a vehicle key using the vehicle testing device shown in FIG. 2.

Turing to FIG. 7, the method in which the vehicle key VK is tested is shown. First in step S100, the testing device 12 is opened and in step S110 a vehicle key VK is inserted in to the testing device 12. In the step S120 the vehicle key VK is connected to the control circuit 22. In one embodiment, the vehicle key VK is opened and the electrical input 66 is physically coupled to the vehicle key circuit board (not shown). Such a connection enables the operator to provide specific instructions to the vehicle key VK. In step S130, the testing device 12 is connected to the BCM through the connectors 44-48, and in step S140 the testing device 12 is connected to the control system through the connector 42. The testing device 12 is then closed in step S150 by placing the cover 28 so as to cover the opening 60 and prevent signals from passing through the walls of the housing 14. The vehicle key VK can then be tested using the control system in step S160. The results of the test can then be determined based on the BCM in step S170. Once the testing is completed, the vehicle key VK can be removed from the testing device 12 in step S180.

In one example, once the vehicle key VK is positioned within the base 26 and the cover 28 is attached to the base 26, the operator operates the control system to instruct the control circuit 22 to cause the vehicle key VK to send a wireless signal to open a door of a vehicle V. Additionally, the operator instructs the control circuit 22 to operate the first antenna 16. In response to the instruction, the vehicle key VK sends the door open signal, which is received by the first antenna 16 and transmitted to the LF switch 64. The LF switch 64 then communicates this signal to the BCM. The operator can then determine whether this function of the vehicle key VK is operational. The operator can then test the separate functions of the vehicle V, switch the antenna from the first antenna 16 to the second or third antenna 18 or 20 to simulate the differing antennas of a vehicle V and even alter the voltage supplied to the vehicle key VK to simulate differing battery charges of the vehicle key VK.

Based on the test results an operating is able to determine if the vehicle key VK is fully functional or if there is an error or defect in the vehicle key VK. Thus, the testing device enables a vehicle key VK to be quickly and easily tested without physically using the key on a vehicle. Such a device improves testing time and efficiency.

The LF switch, the BCM and control system are conventional components that are well known in the art. Since LF switch, BCM and control system are well known in the art, these structures will not be discussed or illustrated in detail herein. Rather, it will be apparent to those skilled in the art from this disclosure that the components can be any type of structure and/or programming that can be used to carry out the present invention.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "section" or "element" when used in the singular can have the dual meaning of a single part or a plurality of parts. Accordingly, these terms, as utilized to describe the present invention should be interpreted relative to a vehicle equipped with the vehicle key testing device.

The term "detect" as used herein to describe an operation or function carried out by a component, a section, a device or the like includes a component, a section, a device or the like that does not require physical detection, but rather includes determining, measuring, modeling, predicting or computing or the like to carry out the operation or function.

The term "configured" as used herein to describe a component, section or part of a device includes hardware and/or software that is constructed and/or programmed to carry out the desired function.

The terms of degree such as "substantially" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A vehicle key testing device comprising:
   a housing having an output configured to be in communication with a BCM disposed externally to the housing, the housing defining an interior space and configured to have a vehicle key positioned into the interior space;
   an antenna mounted in the interior space, the antenna configured to receive and simulate communication of at least one of remote start, door unlocking, liftgate activation and alert, and configured to enable the communication to be transmitted to the output; and
   an electrical input configured to activate at least one wireless aspect of the vehicle key to test the vehicle key.

2. The vehicle key testing device according to claim 1, wherein
   the antenna is configured to simulate a vehicle antenna.

3. The vehicle key testing device according to claim 1, further comprising
a low frequency switch connected to the antenna.

4. The vehicle key testing device according to claim 3, wherein
the electrical input is a control circuit connected to the low frequency switch and configured to connect to the vehicle key.

5. The vehicle key testing device according to claim 4, wherein
the control circuit is configured to connect to a control system to control the vehicle key.

6. The vehicle key testing device according to claim 4, wherein
the control circuit is configured to simulate a voltage of a battery of the vehicle key.

7. The vehicle key testing device according to claim 4, wherein
the control circuit is configured to control the at least one wireless aspect of the vehicle key.

8. The vehicle key testing device according to claim 4, wherein
the antenna is a first antenna of a plurality of antennas and the control circuit is configured to selectively activate one of the first antenna and a second antenna of the plurality of antennas.

9. The vehicle key testing device according to claim 1, wherein
the housing is configured to prevent signals from the vehicle key from passing through walls thereof.

10. The vehicle key testing device according to claim 1, wherein
the housing is aluminum.

11. A method of testing a vehicle key, comprising:
placing a vehicle key inside a housing of a key testing device;
coupling the vehicle key to a control circuit;
instructing the control circuit to activate at least one wireless aspect of the vehicle key to test the vehicle key;
receiving a signal from the vehicle key with an antenna disposed inside the housing, the antenna receiving and simulating communication of at least one of remote start, door unlocking, liftgate activation and alert;
transmitting the signal to an output disposed on the housing; and
transmitting the signal to a BCM disposed externally to the housing.

12. The method according to claim 11, wherein
the antenna simulates a corresponding antenna on a vehicle.

13. The method according to claim 11, wherein
the transmitting the signal to the BCM includes transmitting the signal through a low frequency switch connected to the antenna.

14. The method according to claim 11, further comprising
connecting the control circuit to a control system, and controlling the vehicle key via the control system.

15. The method according to claim 14, further comprising
simulating a voltage of a battery of the vehicle key.

16. The method according to claim 14, wherein
the antenna is a first antenna of a plurality of antennas, and selectively activating, via the control circuit, one of the first antenna and a second antenna of the plurality of antennas.

17. The method according to claim 11, further comprising
preventing signals from the vehicle key from passing through walls of the housing.

18. The method according to claim 11, wherein
the housing is aluminum.

* * * * *